(12) United States Patent
Gmür et al.

(10) Patent No.: US 7,195,862 B2
(45) Date of Patent: *Mar. 27, 2007

(54) PROCESS FOR PRODUCING A TOOL INSERT FOR INJECTION MOLDING A MICROSTRUCTURED PART

(75) Inventors: Max Gmür, Mosnang (CH); Thomas Fässler, Hombrechtikon (CH)

(73) Assignee: Weidmann Plastics Technology AG, Rapperswil (CH)

( * ) Notice: Subject to any disclaimer, the term of this patent is extended or adjusted under 35 U.S.C. 154(b) by 452 days.

This patent is subject to a terminal disclaimer.

(21) Appl. No.: 10/720,965

(22) Filed: Nov. 24, 2003

(65) Prior Publication Data

US 2005/0110180 A1    May 26, 2005

(30) Foreign Application Priority Data

Nov. 25, 2002    (EP) ................................ 02079901

(51) Int. Cl.
*G03F 7/00* (2006.01)

(52) U.S. Cl. ............................ 430/320; 216/2; 216/39; 205/70; 264/219

(58) Field of Classification Search .................... None
See application file for complete search history.

(56) References Cited

U.S. PATENT DOCUMENTS

| | | | |
|---|---|---|---|
| 5,618,567 A | | 4/1997 | Hara et al. |
| 6,242,163 B1 | | 6/2001 | Stampfl et al. |
| 6,764,924 B1 | * | 7/2004 | Gmur .................... 438/455 |
| 2002/0098611 A1 | | 7/2002 | Change et al. |

OTHER PUBLICATIONS

Olsson et al., "Valve-Less Diffuser Micropumps Fabricated Using Thermoplastic Replication", Micro Electro Mechanical Systems, 1997. MEMS'97, Proceedings, IEEE., Jan. 26, 1997.

* cited by examiner

Primary Examiner—John A. McPherson

(57) ABSTRACT

Process for producing a tool insert for injection molding a microstructured part fabricated of a synthetic material, a metal or a ceramic material and which comprises an arrangement of microchannels and which further comprises an arrangement of through-going orifices extending in a substantially perpendicular manner with respect to the outer surface of the part. The process comprises the following steps:

(1) microstructuring the front side of a first wafer by means of plasma etching to form the arrangement of microchannels, which are formed on the front side of the wafer, (2) removing the etching mask from the front side of the first wafer, (3) microstructuring the rear side of the first wafer by means of plasma etching to form the arrangement of through-going orifices which extend in a substantially perpendicular manner with respect to the front side of the first wafer, (4) removing the etching mask from the rear side of the first wafer, (5) bonding the rear side of the first wafer to a carrier substrate to form a master, (6) electrochemically depositing a metal layer on the front side of the first wafer and in the through-going orifices which are present therein, wherein the deposited metal layer achieves a depth which is greater than the depth of the microchannels on the front side of the first wafer, and (7) separating the metal layer from the master, wherein the separated metal layer can be used as a tool insert for injection molding a part and has integrated in the metal layer piercing punches, each such punch having a shape and dimensions defined by the shape and dimensions of a corresponding one of the through-going orifices provided in the first wafer.

16 Claims, 3 Drawing Sheets

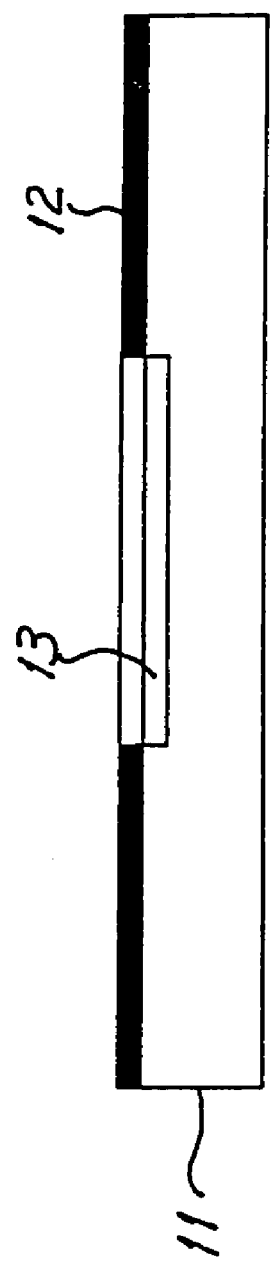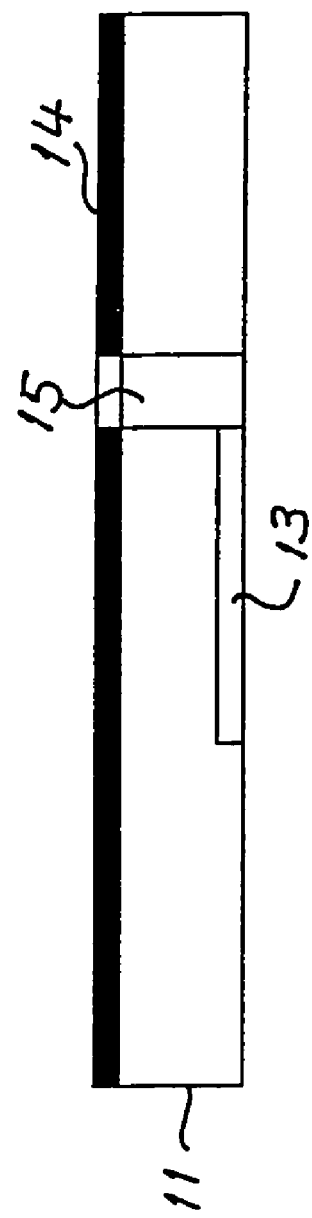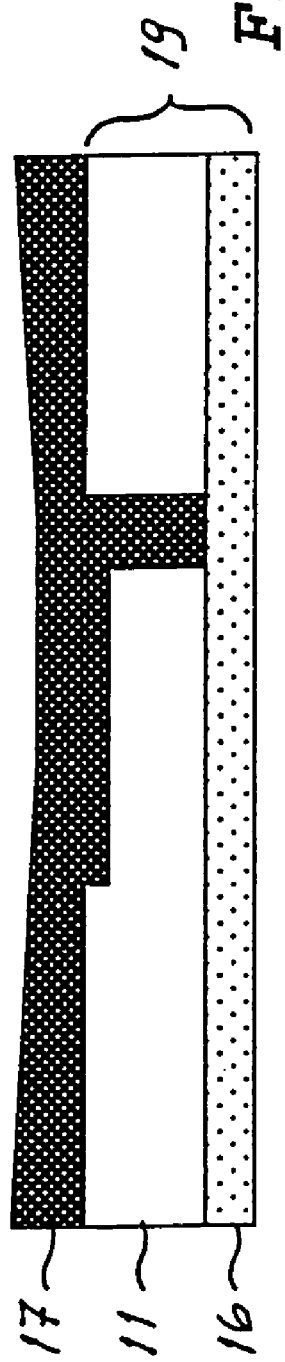

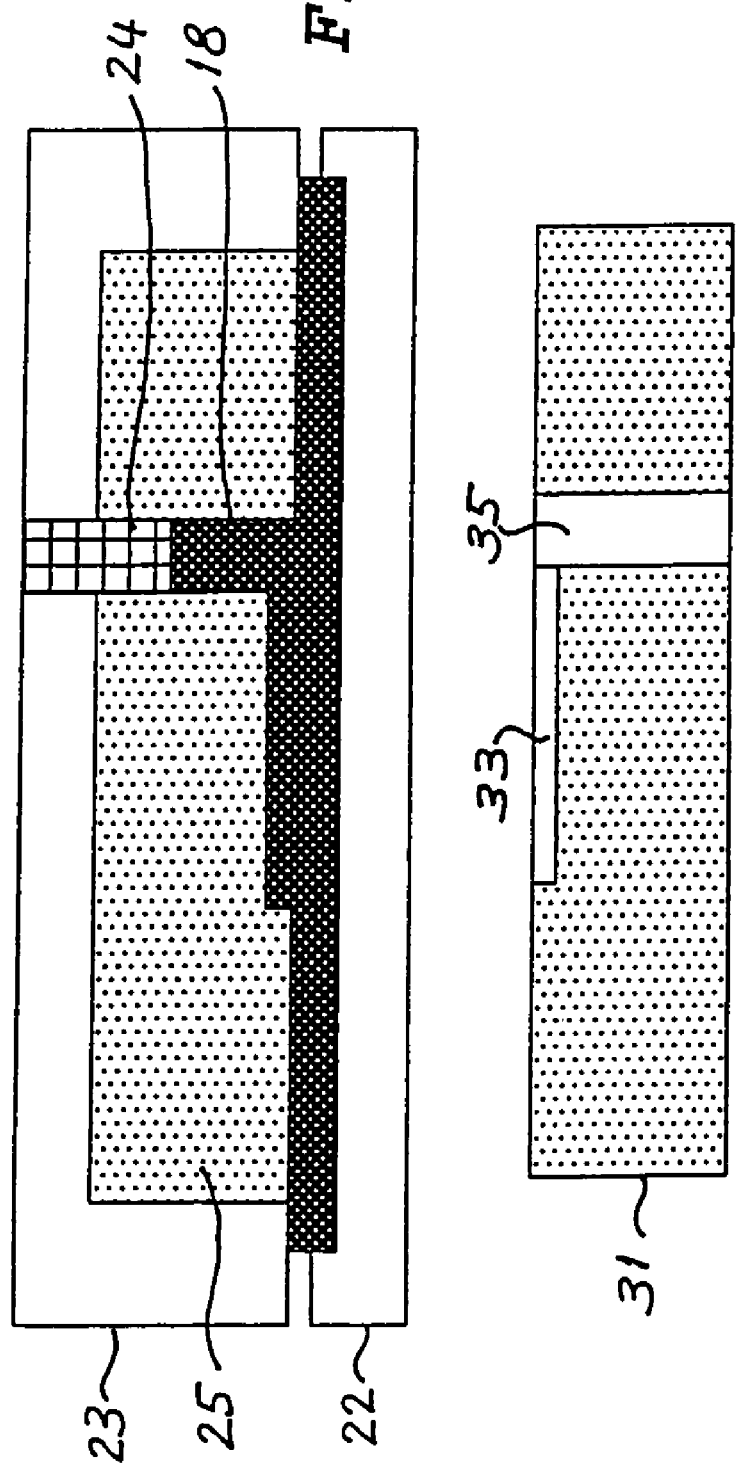

PROCESS FOR PRODUCING A TOOL INSERT FOR INJECTION MOLDING A MICROSTRUCTURED PART

FIELD OF THE INVENTION

The invention relates to a process for producing a tool insert for injection molding a part, the part being fabricated of a synthetic material, a metal or a ceramic material and having an arrangement of microchannels along with an arrangement of through-going orifices. The invention also relates to a process of molding a part using the tool insert.

BACKGROUND OF THE INVENTION

Parts of the above mentioned type, which contain fluid channels, require through-going orifices so that the fluid can be supplied and carried away. Through-going orifices can be worked into the part using mechanical processes after the injection molding process. However, it is much more efficient to produce the through-going orifices at the time of injection molding. For this purpose pins (hereinafter referred to as 'piercing punches') are inserted into the two tool halves at the sites where the part is to comprise a through-going orifice and as the two tool halves are closed two mutually opposite piercing punches always push against each other (hereinafter referred to as 'squeezing'). During the subsequent process of injecting the material melt, for example, the synthetic material melt, through-going orifices are formed where the piercing punches are located.

The requirements in micro-injection molding processes for the piercing punches to fit accurately into the tools, in particular on the microstructured tool halves, are much higher than in conventional injection molding processes, the reason being, that in order to form microstructures of identical shapes, the material melt must have an extremely low viscosity, but this increases the risk that the material melt penetrates between the piercing punch and the tool into where they fit together, where it forms a flash. This flash can lead to the connection between the through-going orifice and the microchannel becoming partially or completely blocked, thus rendering the microchannel and the entire part unusable. A further disadvantage is that the through-going orifices in the case of microstructured parts must also be small, on the one hand so that they do not occupy unnecessary space and on the other hand so that they receive extremely small volumes of fluid. The manufacturing costs are correspondingly higher. At this moment in time fitting orifices for piercing punches with a diameter of less than 1 millimeter can currently only be produced with the required precision at great effort and cost.

SUMMARY OF THE INVENTION

Broadly, one aspect of the present invention relates to a technique for making a portion of a mold having at least one microchannel and at least one through-going orifice by forming the microchannel and the through-going orifice respectively on a front and a rear side of a wafer, bonding the wafer to a carrier substrate with the rear side of the wafer being adjacent to the carrier substrate, depositing a metal layer on the wafer that fills the microchannel and the through-going orifice, and then separating the metal layer from the master. Another broad aspect of the present invention relates to molding a part using a mold incorporating the mold portion that has been fabricated as described above.

A first aim of the invention is to provide a process for producing a microstructured tool insert of the type mentioned above which eliminates the defects of the above mentioned processes.

In accordance with a first aspect of the invention this first aim is achieved with a first process of the above-mentioned kind which comprises the following steps:
  (a) photo-lithographically masking the front side of a first wafer with a first etching mask which corresponds to an arrangement of microchannels,
  (b) microstructuring the front side of the first wafer by means of plasma etching to form the arrangement of microchannels on the front side of the wafer,
  (c) removing the first etching mask from the front side of the first wafer,
  (d) photo-lithographically masking the rear side of the first wafer with a second etching mask which corresponds to an arrangement of through-going orifices to be formed in the first wafer,
  (e) microstructuring the rear side of the first wafer by means of plasma etching to form the arrangement of through-going orifices, each such orifice extending in a substantially perpendicular manner with respect to the front side of the first wafer,
  (f) removing the second etching mask from the rear side of the first wafer,
  (g) bonding the rear side of the first wafer to a carrier substrate to form a master,
  (h) applying an electrically conductive thin layer to the microstructured front side of the first wafer and to the carrier substrate surfaces which can be accessed through the through-going orifices mentioned,
  (i) electrochemically depositing a metal layer on the front side of the first wafer and in the through-going orifices which are present therein, wherein the deposited metal layer reaches a depth which is greater than the depth of the microchannels on the front side of the first wafer,
  (j) making planar the outer surface of the deposited metal layer, and
  (k) separating the metal layer from the master, wherein the separated metal layer can be used as a tool insert for injection molding a part and has integrated in the metal layer piercing punches, each such punch having a shape and dimensions defined by the shape and dimensions of a corresponding one of the through-going orifices.

In a preferred embodiment of this first process the first wafer is a silicon wafer.

In a preferred embodiment of this first process the carrier substrate is a Pyrex® glass wafer.

In a preferred embodiment of this first process the carrier substrate is a silicon wafer.

In a preferred embodiment of this first process the deposited metal layer is a nickel layer.

In a preferred embodiment of this first process the deposited metal layer is extremely strong and hard.

Furthermore, a second aim of the invention is to provide a process for injection molding a part which is produced from a synthetic material, a metal or from a ceramic material and which comprises an arrangement of microchannels which are formed on a substantially planar outer surface and which comprises an arrangement of through-going orifices which extend substantially perpendicular to the outer surface of the part.

In accordance with a second aspect of the invention this second aim is achieved with a second process of the above-mentioned kind, wherein a tool is used for the injection molding process which is formed from a first and a second tool half, and which comprises the following steps:

(a) installing a first tool insert in a first tool half which serves to shape the arrangement of microchannels, wherein the first tool insert is produced according to a process of the above-mentioned kind and has a first arrangement of piercing punches integrated in the first tool insert, (b) installing a second tool insert in a second tool half which is arranged opposite the first tool half, wherein the second tool insert has a second arrangement of piercing punches which push on a corresponding piercing punch of the first arrangement in each case as the tool for the injection molding is closed, (c) closing the tool for injection molding formed from the first and second tool half, (d) injecting a material melt into the cavity between the first and the second tool half, (e) cooling the injected material melt, and (f) ejecting from the tool for injection molding a part which is formed by the setting of the injected material melt and which part comprises an arrangement of through-going orifices which are formed during the injection molding process by the piercing punches pushing against each other.

The advantages achieved with the processes in accordance with the invention are in particular as follows:

Using the process in accordance with the invention, the piercing punches are integrated into a microstructured tool insert. This obviates the need for a transition to the microchannel and tool in the form of a gap and there is absolutely no risk of a flash forming between the respective piercing punch and microchannel tool insert. Piercing punches produced in this manner are called 'integrated piercing punches' as they are integrated parts of the tool insert. Integrated piercing punches of this type can be produced in accordance with the invention in any shape and as small as desired. As they care produced in the batch process, as many integrated piercing punches as desired can be produced simultaneously, which has an extremely advantageous effect on the flow time, quality and costs. In accordance with the invention, in order to produce the microstructured tool insert lithographic, chemical and physical microstructuring processes are used, which are batch processes. However, most mechanical structuring processes (for example, drilling, milling, polishing) are performed sequentially which particularly in the case where there are a large number of structures has a crucial effect on the time involved and has a negative effect with respect to the flow time, quality and costs.

BRIEF DESCRIPTION OF THE DRAWINGS

The subject invention will now be described in terms of its preferred embodiments with reference to the accompanying drawings. These embodiments are set forth to aid the understanding of the invention, but are not to be construed as limiting.

FIG. 1 shows the microstructuring of the front side of a first wafer performed by trench etching using plasma etching to form an arrangement of microchannels, FIG. 2 shows the microstructuring of the rear side of the first wafer in FIG. 1 by through-etching using plasma etching to form an arrangement of through-going orifices, FIG. 3 shows the electrochemical deposition of a metal layer on the front side of the first wafer and in the through-going orifices which are provided therein, FIG. 6 illustrates the injection of a material melt into the cavity between the lower and the upper tool halves of a tool for injection molding a part, and FIG. 7 shows the part ejected from the injection molding tool.

DETAILED DESCRIPTION OF PREFERRED EMBODIMENTS

Figure 4:
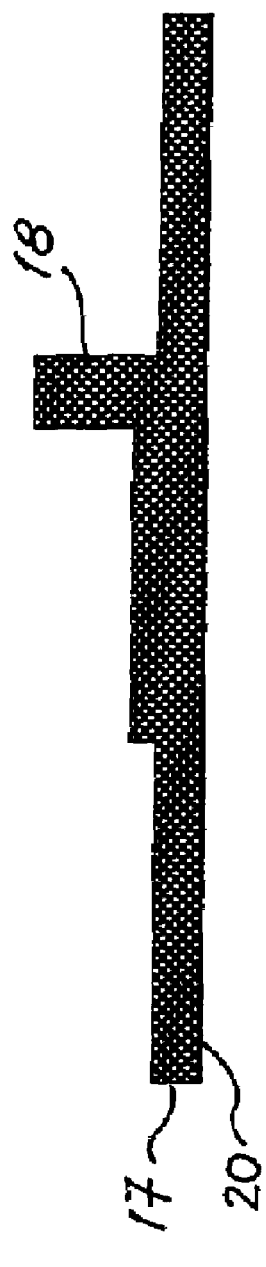
FIG. 4 shows the metal layer separated from the first wafer and the carrier substrate bonded thereto.

Referring to FIGS. 1 to 4, a process for producing a microstructured tool insert for injection molding a synthetic material part is described below. This process can also be used for injection molding a part which is produced from a metal or from a ceramic material.

As illustrated in FIG. 1, the front side of a silicon wafer 11 is photo-lithographically masked with an etching mask 12 and subsequently structured (hereinafter referred to as 'trench etching') down to the desired depth by means of dry etching in a plasma (technical term: DRIE=Deep Reactive Ion Etching) consisting of ions and reactive fluorine radicals, wherein the fluorine radicals remove the silicon. By means of trench etching, an arrangement of microchannels 13 is produced in this manner on the front side of the silicon wafer 11. The microchannels 13 have, for example, a depth of 50 micrometer. The silicon wafer 11 has, for example, a thickness of 250 micrometer.

As illustrated in FIG. 2, subsequently the etching mask 12 on the front side, which has just been microstructured, of the silicon wafer 11 is removed, the wafer 11 is turned, the rear side of the silicon wafer 11 is then masked photo-lithographically with an etching mask 14 and subsequently it is structured by means of dry etching according to the above described method, wherein this time the structures are driven through the wafer 11 (hereinafter referred to as 'through-etching') and thus an arrangement of through-going orifices 15 is produced which correspond to the integrated piercing punches to be formed.

Subsequently, the etching mask 14 is removed and the wafer 11 which is now structured is bonded to a carrier substrate 16 in order to increase the intrinsic stability and to seal the rear side of the wafer 11 so that nickel can be applied electro-chemically. A so-called Galvano master 19 is formed by bonding the wafer 11 and carrier substrate 16 in this manner.

Both Pyrex® glass wafers, i.e., glass with a high proportion of sodium, and also silicon wafers are suitable as the carrier substrate 16.

Pyrex® glass wafers are inseparably connected by means of anodic bonding to the microstructured silicon wafer. During the anodic bonding process, a high voltage, for example, of 1000 V is applied to the silicon and Pyrex® glass wafers which are laid one on top of the other. Sodium ions diffuse from the Pyrex® glass into the silicon and produce a high-strength ionic connection between the Pyrex® glass and silicon. The diffusion is further accelerated by increasing the temperature of the wafer, for example, to 400° C.).

Silicon wafers are inseparably connected by means of silicon fusion bonding to the microstructured silicon wafer. During the silicon fusion bonding, the surfaces to be connected on the silicon substrate and the microstructured silicon wafer are conditioned and subsequently covalently bonded under pressure and at a temperature provided that the two surfaces to be connected demonstrate an extremely low degree of roughness (less than 0.5 Nanometer), so that the two surfaces come into direct contact with each other.

The next process step is to provide the microstructured silicon wafer 11 together with the carrier substrate 16, together referred to as the master 19, with a thin conductive layer which serves as the start layer for the electrochemical deposition described below. Gold, silver and nickel, for example, are suitable and they are physically applied by means of the sputtering process (also known under the term 'cathode atomization') or vapor deposition after coating with an adhesive layer of aluminum, titanium or chromium.

Subsequently, as illustrated in FIG. 3, the master 19 is electrically contacted via the conductive start layer and a thick metal layer 17, preferably a nickel layer, is electrochemically deposited to form a mechanically stable backing plate which has a relatively high level of strength or hardness. In order to increase the hardness of the metal layer 17 whilst simultaneously maintaining the ductility of the nickel layer, the electrolyte contains approx. 10% cobalt. In this manner, nickel hardness values of 46-60 HRC (Hardness Rockwell C) can be achieved. The metal layer 17 should be as hard as possible, as this is necessary for its intended function.

Following the above mentioned deposition of, for example, a nickel layer 17, also called nickel shim, the rear side 20 of the nickel shim is first made planar. Suitable processes are eroding and polishing. Subsequently, the microstructured nickel tool insert 17 (hereinafter referred to as the 'shim') must be separated from the master 19. For this purpose, the master 19 is either mechanically separated from the shim 17 or dissolved in a suitable wet etching chemical process or by means of a dry etching process. FIG. 4 illustrates the separate tool insert 17.

Figure 5:
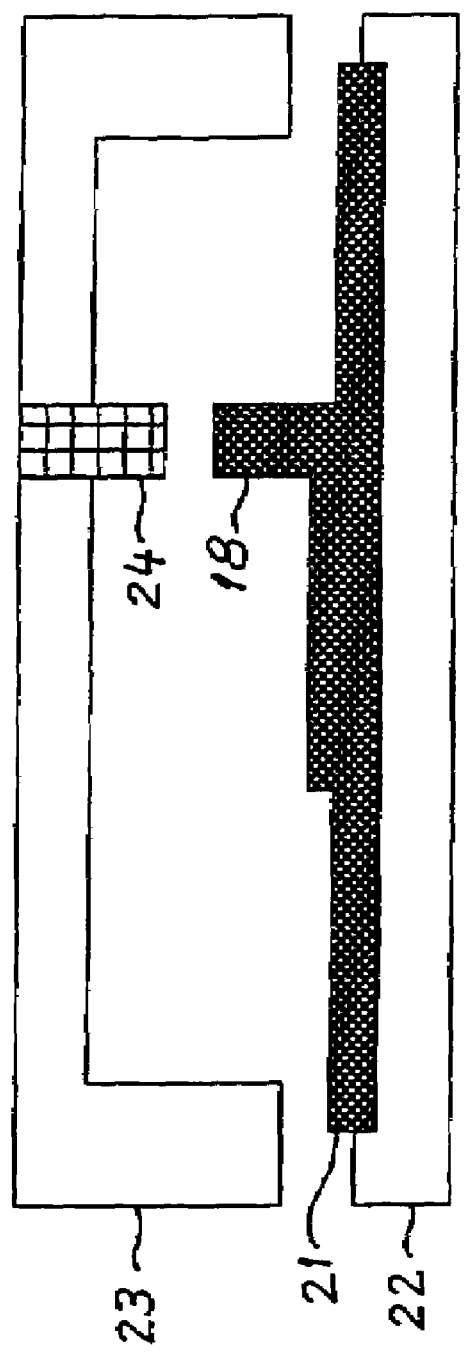
FIG. 5 illustrates the use of a metal layer separated from the first wafer and from the carrier substrate bonded thereto as a shaping component in a tool half which is produced in accordance with the invention and is used as a component of a tool half of a tool for injection molding a part.

As illustrated in FIG. 5, for the purpose of injection molding a synthetic material part the nickel shim 17 with the integrated piercing punches 18 is installed in a tool half 22. Piercing punches 24 are inserted on the opposite tool half 23 and as the tool is closed they squeeze onto the integrated piercing punches 18 on the microstructured nickel shim 17. The inserted piercing punches 24 are manufactured in a conventional manner as they lie on the unstructured, non-critical side of the synthetic material part and therefore the accuracy of the fit is not so critical.

As illustrated in FIG. 6, as the injection molding tool is closed the inserted piercing punches 24 of one tool half push on the integrated piercing punches 18 on the shim 17. In addition, the tool half squeezes with the inserted piercing punches 24 on the edge 21 directly on the shim 17 and thus defines the outer contour of the synthetic material part 31. An arrangement of through-going orifices 35 is formed in the synthetic material part 31 at the site of the piercing punches as the synthetic material melt 35 is injected.

Once the synthetic material melt 25 becomes rigid, the synthetic material part 31 schematically illustrated in FIG. 7 is ejected and removed.

It is particularly advantageous when using the above described piercing punches 18 integrated in the tool insert that the risk of flashes occurring on the microstructured side of the synthetic material part is eliminated in particular in each case between the through-going orifice and the microchannel. Moreover, extremely small through-going orifices can also be produced easily.

The simultaneous production in accordance with the invention of integrated piercing punches 18 in the batch process and their use when injection molding a synthetic material part 31 which comprises an arrangement of microchannels 33 which are formed on a substantially planar outer surface, and which comprises an arrangement of through-going orifices 35 which extend in a substantially perpendicular manner with respect to the outer surface of the synthetic material part 31 renders it possible to achieve great savings in time and cost.

Although preferred embodiments of the invention have been described using specific terms, such description is for illustrative purposes only, and it is to be understood that changes and variations may be made without departing from the spirit or scope of the following claims.

What is claimed is:

1. A process for producing a microstructured tool insert for injection molding a part, said part being fabricated of a synthetic material, a metal or a ceramic material and having an arrangement of microchannels and an arrangement of through-going orifices, each such orifice extending in a substantially perpendicular manner with respect to an outer surface of the part, said process comprising:
   (a) photo-lithographically masking the front side of a first wafer with a first etching mask which corresponds to the arrangement of microchannels,
   (b) microstructuring the front side of the first wafer by means of plasma etching to form the arrangement of microchannels on the front side of the wafer,
   (c) removing the first etching mask from the front side of the first wafer,
   (d) photo-lithographically masking the rear side of the first wafer with a second etching mask which corresponds to the arrangement of through-going orifices,
   (e) microstructuring the rear side of the first wafer by means of plasma etching to form said arrangement of through-going orifices,
   (f) removing the second etching mask from the rear side of the first wafer,
   (g) bonding the rear side of the first wafer to a carrier substrate to form a master,
   (h) applying an electrically conductive thin layer to the microstructured front side of the first wafer and to the carrier substrate surfaces which can be accessed through the through-going channels mentioned,
   (i) electrochemically depositing a metal layer on the front side of the first wafer and in the through-going orifices which are present therein, wherein the deposited metal layer reaches a depth which is greater than the depth of the microchannels on the front side of the first wafer,
   (j) making planar the outer surface of the deposited metal layer, and
   (k) separating the metal layer from the master, wherein the separated metal layer can be used as a tool insert for injection molding a part and has pins integrated in the metal layer, each such pin having a shape and dimensions defined by the shape and dimensions of a corresponding one of the through-going orifices provided in the first wafer.

2. The process of claim 1 wherein the first wafer is a silicon wafer.

3. The process as claimed in claim 1 wherein the carrier substrate is a glass wafer.

4. The process as claimed in claim 1 wherein the carrier substrate is a silicon wafer.

5. The process of claim 1, wherein the deposited metal layer is a nickel layer.

6. The process of claim 1 wherein the deposited metal layer is strong and hard.

7. A process for injection molding a part fabricated of a synthetic material, a metal or a ceramic material and which comprises an arrangement of microchannels, and which further comprises an arrangement of through-going orifices, each such orifice extending in a substantially perpendicular manner with respect to an outer surface of the part, and wherein a tool is used for the injection molding process which is formed from a first and a second tool half, said process comprising:
   (a) installing a first tool insert in a first tool half which serves to shape the arrangement of microchannels, wherein the first tool insert is produced according to a process of photo-lithographically masking the front side of a first wafer with a first etching mask which corresponds to the arrangement of microchannels, microstructuring the front side of the first wafer by means of plasma etching so as to form the arrangement of microchannels, removing the first etching mask from the front side of the first wafer, photo-lithographically masking the rear side of the first wafer with a second etching mask which corresponds to an arrangement of through-going orifices, microstructuring the rear side of the first wafer by means of plasma etching to form the arrangement of through-going orifices, which extend in a substantially perpendicular manner with respect to the front side of the first wafer, removing the second etching mask from the rear side of the first wafer, bonding the rear side of the first wafer to a carrier substrate to form a master, applying an electrically conductive thin layer to the microstructured front side of the first wafer and to the carrier substrate surfaces which can be accessed through the through-going channels mentioned, electrochemically depositing a metal layer on the front side of the first wafer and in the through-going orifices which are present therein, wherein the deposited metal layer reaches a depth which is greater than the depth of the microchannels on the front side of the first wafer, making planar the outer surface of the deposited metal layer, and separating the metal layer from the master, wherein a first arrangement of pins is integrated in the metal layer, each such pin corresponding to an associated one of the through-going orifices,
   (b) installing a second tool insert in a second tool half which is arranged opposite the first tool half, wherein the second tool insert has a second arrangement of pins, each of which pushes on a corresponding pin of the first arrangement when the tool for the injection molding is closed,
   (c) closing the tool for injection molding formed from the first and second tool half,
   (d) injecting a material melt into the cavity between the first and the second tool half,
   (e) cooling the injected material melt, and
   (f) ejecting from the tool for injection molding a part which is formed by the setting of the injected material melt and which part comprises an arrangement of through-going orifices which are formed during the injection molding process by the pins on the first and second tool half pushing against each other.

8. A process for producing a tool insert for use as a component of a mold for molding a part, said part having at least one microchannel and at least one through-going orifice, said process comprising:
   (a) forming said microchannel on a front side of a wafer,
   (b) forming said through-going orifice on a rear side of the wafer,
   (c) attaching the wafer to a carrier substrate with the rear side of the wafer being adjacent to the carrier substrate,
   (d) depositing a metal layer on the wafer that fills said microchannel and said through-going orifice, and
   (e) separating the metal layer from the master.

9. The process of claim 8 wherein forming said microchannel includes masking the front side of the wafer with a first etching mask which corresponds to the microchannel.

10. The process of claim 9 wherein forming the microchannel includes etching the front side of the wafer after masking this side with the first etching mask.

11. The process of claim 10 wherein the etching is plasma etching.

12. The process of claim 8 wherein forming of said through-going orifice includes masking the rear side of the wafer with a second etching mask which corresponds to the through-going orifice.

13. The process of claim 12 wherein forming the through-going orifice includes etching the rear side of the wafer after masking of this side with the second etching mask.

14. The process of claim 13 wherein the etching is plasma etching.

15. The process of claim 8 wherein the depositing of the metal layer includes applying an electrically conductive thin layer to the front side of the wafer and to the carrier substrate surfaces followed by electrochemically depositing a metal layer on the front side of the first wafer and in the through-going orifice.

16. A process for molding a part which comprises at least one microchannel, and which further comprises at least one through-going orifice, and wherein a mold is used for the molding process, said process comprising the steps of:
   (a) installing a first tool insert into a first mold half which serves to shape the microchannel and the through-going orifice, wherein the first tool insert is produced according to a process comprising the steps of forming said microchannel on a front side of a wafer, forming said through-going orifice on a rear side of the wafer, bonding the wafer to a carrier substrate with the rear side of the wafer being adjacent to the carrier substrate, depositing a metal layer on the wafer that fills said microchannel and the said through-going orifice and separating the metal layer from the master
   (b) installing a second mold half which is arranged opposite the first mold half,
   (c) closing the mold by abutting the first and second mold half,
   (d) injecting a material into the mold,
   (e) cooling the injected material, and
   (f) ejecting the part from the mold.

* * * * *